United States Patent
Huang et al.

(10) Patent No.: US 10,578,662 B2
(45) Date of Patent: Mar. 3, 2020

(54) GROUNDING DETECTION APPARATUS, CONTROL METHOD THEREOF AND POOL SYSTEM

(71) Applicant: BESTWAY INFLATABLES & MATERIAL CORP., Shanghai (CN)

(72) Inventors: Shuiyong Huang, Shanghai (CN); Jiang Xu, Shanghai (CN)

(73) Assignee: BESTWAY INFLATABLES & MATERIAL CORP., Shanghai (CN)

( * ) Notice: Subject to any disclaimer, the term of this patent is extended or adjusted under 35 U.S.C. 154(b) by 3 days.

(21) Appl. No.: 15/392,501

(22) Filed: Dec. 28, 2016

(65) Prior Publication Data

US 2018/0149688 A1    May 31, 2018

(30) Foreign Application Priority Data

Nov. 25, 2016    (CN) .................... 2016 2 1275978 U

(51) Int. Cl.
*G01R 31/02*    (2006.01)
*B60L 3/00*    (2019.01)

(52) U.S. Cl.
CPC .................. *G01R 31/025* (2013.01)

(58) Field of Classification Search
CPC ........ G01R 31/025; B60L 3/0069; H02H 3/17
See application file for complete search history.

(56) References Cited

U.S. PATENT DOCUMENTS

| 6,433,552 | B1 * | 8/2002 | Williams ............... G01R 29/24 324/455 |
| 6,894,477 | B1 | 5/2005 | Cuplin et al. |
| 8,571,738 | B1 * | 10/2013 | Potter .................. B60L 3/0046 324/434 |
| 2006/0133181 | A1 * | 6/2006 | Amano .................. G11C 5/141 365/229 |

(Continued)

FOREIGN PATENT DOCUMENTS

EP    0 484 567    5/1992

OTHER PUBLICATIONS

Extended European Search Report dated Aug. 17, 2017, in European Patent Application No. 16207607.9, 11 pages.

*Primary Examiner* — Akm Zakaria
(74) *Attorney, Agent, or Firm* — AJ Moss; Dickinson Wright PLLC

(57) ABSTRACT

A grounding detection apparatus, a control method thereof and a pool system are provided. The grounding detection apparatus includes a detection circuit, which includes a live line connection terminal, a neutral line connection terminal, a grounding terminal, a first impedance circuit, a sampling resistance, a differential amplifying circuit and a comparison unit; a first terminal of the first impedance circuit is connected with the live line connection terminal; a second terminal of the first impedance circuit is connected with a first terminal of the sampling resistance and a first input terminal of the differential amplifying circuit; the sampling resistance is configured to convert a sampling current to a (Continued)

sampling voltage; the differential amplifying circuit is configured to amplify the sampling voltage to form an amplified sampling voltage; and the comparison unit is configured to compare a threshold voltage and the amplified sampling voltage and output a comparison result.

38 Claims, 7 Drawing Sheets

(56) References Cited

U.S. PATENT DOCUMENTS

| | | | |
|---|---|---|---|
| 2009/0102488 A1* | 4/2009 | Morini | G01R 31/025 |
| | | | 324/509 |
| 2011/0175596 A1 | 7/2011 | Chen | |
| 2013/0135047 A1* | 5/2013 | Danioni | H03F 3/3022 |
| | | | 330/252 |
| 2014/0049261 A1* | 2/2014 | Flack | G01R 31/025 |
| | | | 324/509 |
| 2015/0171806 A1* | 6/2015 | Imayama | H03F 3/187 |
| | | | 381/121 |
| 2016/0131608 A1* | 5/2016 | Howes, Jr. | G01N 27/49 |
| | | | 324/693 |

* cited by examiner

GROUNDING DETECTION APPARATUS, CONTROL METHOD THEREOF AND POOL SYSTEM

CROSS-REFERENCE TO RELATED APPLICATIONS

This application claims the benefit of priority to Chinese Patent Application No. 201621275978.X, titled "GROUNDING DETECTION APPARATUS AND POOL SYSTEM", filed on Nov. 25, 2016, the entire disclosure of which are incorporated herein by reference.

TECHNICAL FIELD

The present invention relates to electronic field, and more particularly, to a grounding detection apparatus, a control method of the grounding detection apparatus and a pool system.

BACKGROUND

Electrical leakage of an electrical appliance or induced electricity generated on a shell when the electrical appliance is in use, can be led to earth through a grounding line, so as to avoid personal electric shock, which can protect personal safety. However, the grounding line may be disconnected or poorly contacted which may lead to security incidents. Thus, there is a need to detect whether the grounding line is well connected.

In a conventional technology, grounding detection requires a special instrument, and needs to be carried out under a power-off state of the electrical appliance, and the detection method is complicated. Further, the conventional detection method can only detect whether the grounding line is in good condition, but can not detect a poor contact of the grounding line with an external ground.

SUMMARY

The problem solved by the present disclosure is that a grounding detection method of a conventional electrical appliance is complicated.

In order to solve the aforementioned problems, a grounding detection apparatus is provided in the present disclosure. The grounding detection apparatus includes a detection circuit, wherein the detection circuit includes a live line connection terminal, a neutral line connection terminal, a grounding terminal, a first impedance circuit, a sampling resistance, a differential amplifying circuit and a comparison unit; a first terminal of the first impedance circuit is connected with the live line connection terminal, and a second terminal of the first impedance circuit is connected with a first terminal of the sampling resistance and a first input terminal of the differential amplifying circuit; a second terminal of the sampling resistance is connected with a second input terminal of the differential amplifying circuit and the grounding terminal; the sampling resistance is configured to convert a sampling current to a sampling voltage, wherein the sampling current is a current on a circuit from the live line connection terminal to the grounding terminal; the differential amplifying circuit is configured to amplify the sampling voltage to form an amplified sampling voltage; and the comparison unit is configured to compare a threshold voltage and the amplified sampling voltage and output a comparison result through an output terminal of the comparison unit.

A pool system is also provided in the present disclosure. The pool system includes a pool, a control system of the pool, and the grounding detection apparatus, wherein a grounding terminal of the control system is connected with the grounding terminal of the grounding detection apparatus.

A control method of the grounding detection apparatus is provided according to an embodiment of the present disclosure. The control method includes: connecting the live line connection terminal to a live line, connecting the neutral line connection terminal to a neutral line, and turning on the grounding detection apparatus; clearing number of voltage changes of the output terminal of the comparison unit; sampling number of voltage changes of the output terminal of the comparison unit within a preset time; and determining a grounding state of the grounding terminal based on the sampled number of voltage changes of the output terminal of the comparison unit.

Optionally, determining the grounding state of the grounding terminal based on the sampled number of voltage changes of the output terminal of the comparison unit includes: determining that the grounding state is abnormal when the number of the voltage changes is not within a preset range; or determining that the grounding state is normal when the number of the voltage changes is within the preset range.

Optionally, sampling the number of voltage changes of the output terminal of the comparison unit within the preset time includes counting once when the voltage changes from high to low.

Compared with a conventional technology, the grounding detection apparatus and the control method of the grounding detection apparatus in the present disclosure can detect whether a grounding line of an electrical appliance is normal, and whether the grounding line is in poor contact with an external ground, without disconnecting a power supply of the electrical appliance.

DETAILED DESCRIPTION

The foregoing and other objects, features and advantages of the present invention will become more apparent from the following detailed description of the preferred embodiments of the present invention when taken in conjunction with the accompanying drawings. It will be understood by those skilled in the art that "linking" in the following embodiments may indicate either a direct connection or a coupling through other elements.

Figure 1:
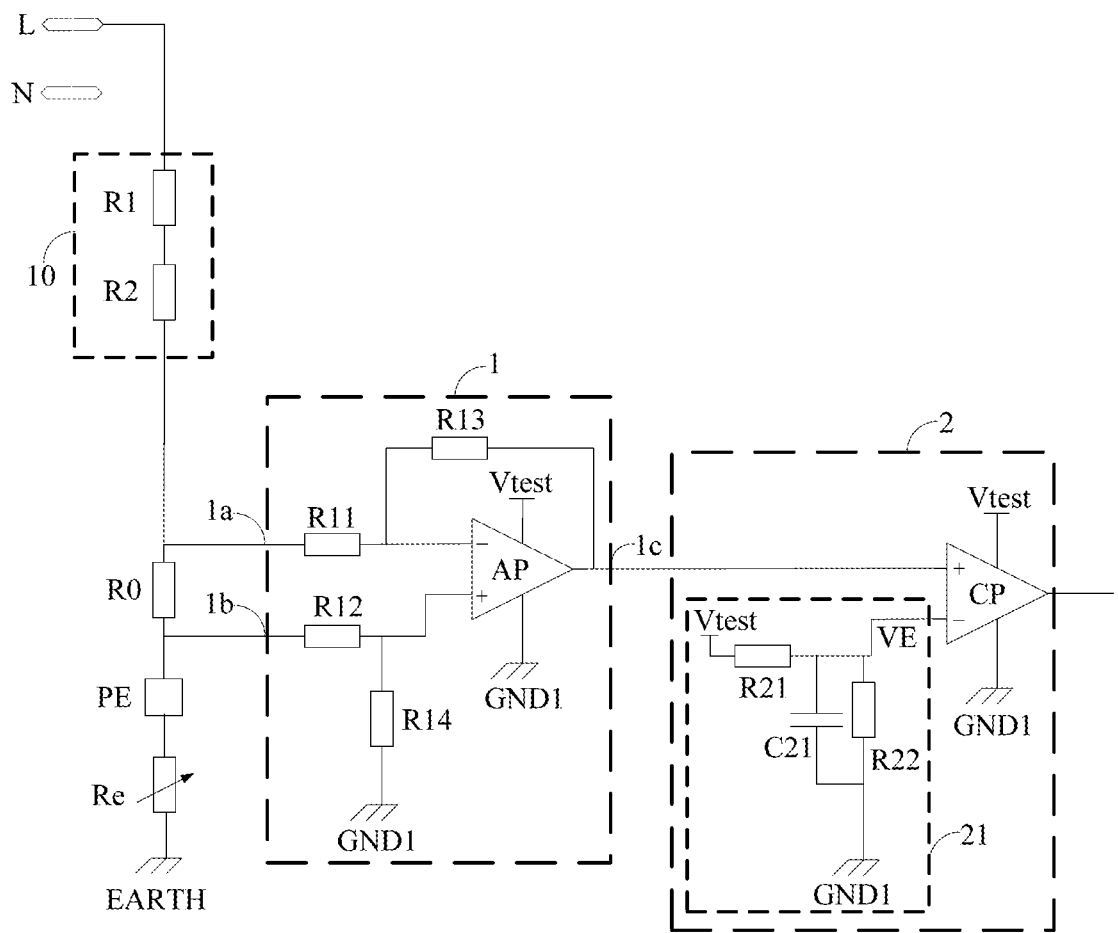
FIG. 1 schematically illustrates a structural diagram of a grounding detection apparatus according to an embodiment of the present disclosure.

Referring to FIG. 1, a grounding detection apparatus is provided according to an embodiment of the present invention. The grounding detection apparatus includes a detection circuit. The detection circuit includes a live line connection terminal L, a neutral line connection terminal N, a grounding terminal PE, a first impedance circuit 10, a sampling resistance R0, a differential amplifying circuit 1 and a comparison unit 2.

A first terminal of the first impedance circuit 10 is connected with the live line connection terminal L. A second terminal of the first impedance circuit 10 is connected with a first terminal of the sampling resistance R0 and a first input terminal 1a of the differential amplifying circuit 1.

A second terminal of the sampling resistance R0 is connected with a second input terminal 1b of the differential amplifying circuit 1 and the grounding terminal PE. The sampling resistance R0 is configured to convert a sampling current to a sampling voltage, wherein the sampling current is a current in a circuit from the live line connection terminal L to the grounding terminal PE.

The differential amplifying circuit 1 is configured to amplify the sampling voltage to form an amplified sampling voltage. The comparison unit 2 is configured to compare a threshold voltage VE with the amplified sample voltage and output a comparison result through an output terminal of the comparison unit 2.

The grounding terminal PE may serve as a grounding line of an electrical appliance. Supposing an external ground is an ideal ground EARTH (potential is 0), when the live line connection terminal L is connected with a live line with a potential of 220V, and the grounding terminal PE is connected with the external ground, a potential difference forms between the live line and the ideal ground EARTH, and a current circuit forms from the live line connection terminal L to the grounding terminal PE. A current in the circuit is the sampling current.

Since both a resistance value of the first impedance circuit 10 and a resistance value of the sampling resistance R0 are constants, a current value Is of the sampling current is determined by a grounding resistance Re, wherein the grounding resistance Re represents a resistance of the grounding terminal PE itself and a resistance between the grounding terminal PE and the ideal ground EARTH. That is, $$Is = K(1/Re) \text{ ($K$ is a constant)}$$

In the present embodiment, the sampling current is converted into the sampling voltage by the sampling resistance R0, and then input to the differential amplifying circuit 1. The differential amplifying circuit 1 amplifies the sampling voltage and outputs the amplified sampling voltage to the comparison unit 2. The comparison unit 2 compares the threshold voltage VE with a voltage value of the amplified sampling voltage, and outputs the comparison result.

From the comparison result, it can be obtained that whether the grounding resistance Re exceeds a predetermined value or not. Wherein a signal on the live line is an alternating current (AC) signal, thus the amplified sample voltage is also an AC signal. The comparison unit 2 compares the AC signal with the threshold voltage VE and outputs the comparison result.

If the grounding line is normal and the grounding line is normally connected with the external ground, then the grounding resistance Re does not exceed the predetermined value, and the comparison result output by the comparing unit 2 is a pulse signal such as a pulse signal of 50 Hz. If the grounding line is disconnected or the grounding line is not properly connected with the external ground, then the grounding resistance Re exceeds the predetermined value, the sampling voltage generated by the sampling resistance R0 is very small, and the comparison result output by the comparison unit 2 is a fixed level, for example a high level or a low level.

It can be seen from the above that if the comparison result output by the comparison unit 2 is a pulse signal, it indicates that the grounding line of the electrical appliance is normal and the grounding line is in good contact with the external ground; if the comparison result output by the comparing unit 2 is a continuous high level or a continuous low level, it indicates that the grounding line of the electrical appliance is abnormal, or the grounding line is in poor contact with the external ground.

Therefore, with the grounding detection apparatus according to the embodiments in the present disclosure, it can detect whether the grounding line of the electrical appliance is normal, and also can detect whether the grounding line is in poor contact with the external ground, without disconnecting a power supply of the electrical appliance.

Further various parts of the grounding detection apparatus will be described in detail below.

The sampling resistance R0 in the present embodiment may have a resistance value of 4.7 KΩ±5%. The sampling current on the sampling resistance R0 is an alternating current with a peak value of no more than 0.7 mA.

Referring to FIG. 1, the first impedance circuit 10 may include a first resistance R1 and a second resistance R2.

A first terminal of the first resistance R1 is connected with the first terminal of the first impedance 10. A second terminal of the first resistance R1 is connected with a first terminal of the second resistance R2. A second terminal of the second resistance R2 is connected with the second terminal of the first impedance 10. The first resistance R1 may have a same resistance value as the second resistance R2.

Specifically, the first resistance R1 may have a resistance value of 1 MΩ±5%, and the second resistance R2 may have a resistance value of 1 MΩ±5%. The first impedance circuit 10 includes two resistances of large resistance values, which can prevent breakdown of the resistances and play a protective role.

The differential amplifying circuit 1 may include a first bias resistance R11, a second bias resistance R12, a third bias resistance R13, a fourth bias resistance R14, and a differential amplifier AP.

A first terminal of the first bias resistance R11 is connected with the first input terminal 1a of the differential amplifying circuit 1. A second terminal of the first bias resistance R11 is connected with a first terminal of the third bias resistance R13 and an inverting phase input terminal of the differential amplifier AP. A first terminal of the second bias resistance R12 is connected with the second input terminal 1b of the differential amplifying circuit 1. A second terminal of the second bias resistance R12 is connected with a first terminal of the fourth bias resistance R14 and a positive phase input terminal of the differential amplifier AP.

A second terminal of the third bias resistance R13 is connected with an output terminal of the differential amplifier AP. A power supply terminal of the differential amplifier AP is configured to receive a power supply voltage Vtest of the grounding detection apparatus. A grounding terminal of the differential amplifier AP is connected with a first reference grounding terminal GND1. The output terminal of the differential amplifier AP is connected with an output terminal 1c of the differential amplifying circuit 1. A second terminal of the fourth bias resistance R14 is configured to be connected with the first reference grounding terminal GND1.

The comparison unit 2 may include a comparison circuit.

The comparison circuit may include a comparator CP and a threshold voltage supply unit 21.

The threshold voltage supply unit 21 is configured to supply the threshold voltage VE to an inverting phase input terminal of the comparator CP. A positive phase input terminal of the comparator CP is connected with the output terminal 1c of the differential amplifying circuit 1. A power supply terminal of the comparator CP is configured to receive the power supply voltage Vtest of the grounding detection apparatus. A grounding terminal of the comparator CP is connected with the first reference grounding terminal GND1. An output terminal of the comparator CP is connected with an output terminal of the comparison unit 2.

When the amplified sample voltage output by the differential amplifying circuit 1 is greater than or equal to the threshold voltage VE, the comparator CP outputs a high level; and when the amplified sample voltage output by the differential amplifying circuit 1 is smaller than the threshold voltage VE, the comparator CP outputs a low level.

Therefore, when the grounding line is normal and the grounding line is normally connected with the external ground, the comparator CP outputs a pulse signal, and when the grounding line is disconnected or the grounding line is poorly contacted with the external ground, the comparator CP outputs a continuous low level.

The threshold voltage supply unit 21 may further include a first voltage divider resistance R21, a second voltage divider resistance R22 and a second filter capacitor C21.

A first terminal of the first divider resistance R21 is configured to receive the power supply voltage Vtest of the grounding detection apparatus. A second terminal of the first voltage divider resistance R21 is connected with a first terminal of the second voltage divider resistance R22, a first terminal of the second filter capacitor C21 and the inverting phase input terminal of the comparator CP, and is configured to supply the threshold voltage VE. A second terminal of the second voltage divider resistance R22 is connected with a second terminal of the second filter capacitor C21 and the first reference grounding terminal GND1.

The threshold voltage VE may be determined by a voltage dividing between the first voltage divider resistance R21 and the second voltage divider resistance R22. The second filter capacitor C21 may serve to filter out interference signals.

Figure 2:
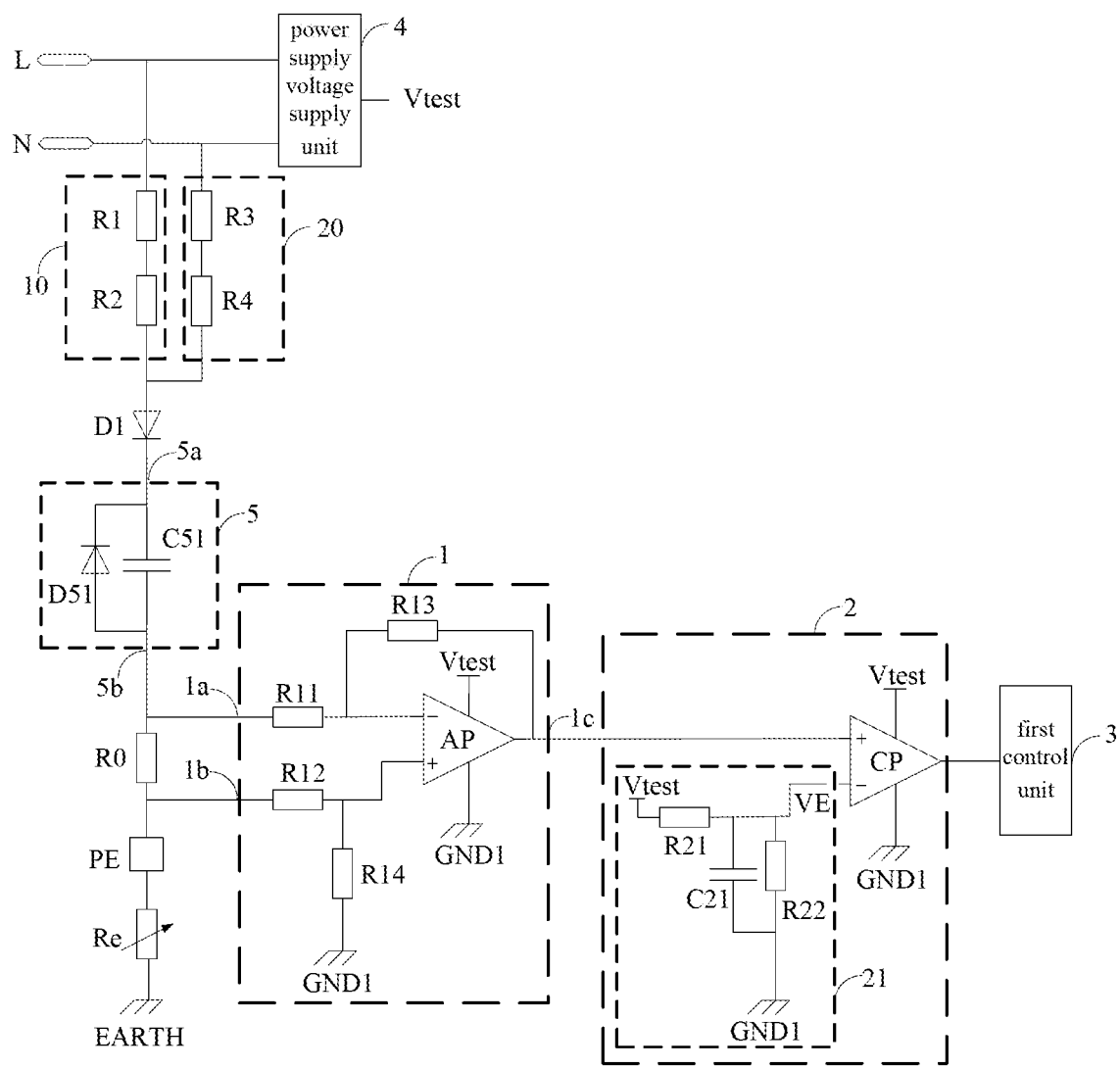
FIG. 2 schematically illustrates a structural diagram of a grounding detection apparatus according to another embodiment of the present disclosure.

Referring to FIG. 2, the detection circuit may further include a first control unit 3, a second impedance circuit 20, a first filter circuit 5 and a power supply voltage supply unit 4.

The first control unit 3 may determine a grounding state of a grounding terminal based on a comparison result output by a comparison unit 2. The first control unit 3 may include a monitoring unit and a determination unit.

The monitoring unit is configured to obtain number of voltage changes of the output terminal of the comparing unit 2 within a preset time. The determination unit is configured to determine that the grounding state is abnormal, when the number of voltage changes obtained by the monitoring unit is not within a preset range. The preset time is 120 ms, and the preset range is 3 times to 20 times.

It has been analyzed previously that when the ground line is normal and the ground line is normally connected with the external ground, the comparison result output by the comparison unit 2 is a pulse signal; and when the grounding line is disconnected or the grounding line is poorly contacted with the external ground, the comparison result output by the comparison unit 2 is a fixed level. Therefore, the monitoring unit obtains the number of voltage changes of the comparison result, and when the number of the voltage changes ranges from 3 times to 20 times in 120 ms, the determination unit may determine that the ground condition is normal; and when the number of the voltage changes is less than 3 times or greater than 20 times in 120 ms, the determination unit may determine that the grounding state is abnormal.

Correspondingly, the detection circuit in the present embodiment may further include an alarm unit (not shown).

The alarm unit is configured to issue an alarm information when the first control unit determines that the grounding state is abnormal, which can remind the user to check the grounding state and disconnect the external power supply to prevent leakage problems.

A first terminal of the second impedance circuit 20 is connected with a neutral line connection terminal N. A second terminal of the second impedance circuit 20 is connected with a first terminal of a sampling resistance R0 and a first input terminal 1a of a differential amplifying circuit 1. The second impedance circuit 20 may include a third resistance R3 and a fourth resistance R4.

A first terminal of the third resistance R3 is connected with the first terminal of the second impedance circuit 20. A second terminal of the third resistance R3 is connected with a first terminal of the fourth resistance R4. A second terminal of the fourth resistance R4 is connected with the second terminal of the second impedance circuit 20. The third resistance R3 may have a same resistance value as the first resistance R1, and the fourth resistance R4 may have a same resistance value as the first resistance R1. That is, the first resistance R1, the second resistance R2, the third resistance R3, and the fourth resistance R4 may have a same resistance.

Specifically, the third resistance R3 has a resistance value of 1 MΩ±5%, and the fourth resistance R4 has a resistance value of 1 MΩ±5%. Similarly to the first impedance circuit 10, the second impedance circuit 20 also includes two resistances of large resistance values, which can prevent breakdown of the resistances and play a protective role.

The differential amplifying circuit 1 in the present embodiment may be a single power supply differential amplifying circuit or a dual power supply differential amplifying circuit.

When the differential amplifying circuit 1 is a dual power supply differential amplifying circuit, a second terminal of the first impedance circuit 10 is connected with the first terminal of the sampling resistance R0 through a first filter circuit 5 (the connection way is not shown in the figure). The first filter circuit 5 may filter interference signals on a sampling current. Specifically, the second terminal of the first impedance circuit 10 is connected with an input terminal of the first filter circuit 5, and a second terminal of the first filter circuit 5 is connected with the first terminal of the sampling resistance R0.

Referring to FIG. 2, when the differential amplifying circuit 1 is a single supply differential amplification circuit, the detection circuit further includes a first rectifier diode D1. The first rectifier diode D1 may rectify a full-wave signal into a half-wave signal.

The first rectifier diode D1 and the first filter circuit 5 are connected in series, and the second terminal of the first impedance circuit 10 is connected with the first terminal of the sampling resistance R0 through the first rectifier diode D1 and the first filter circuit 5. Specifically, a second terminal of the first impedance circuit 10 is connected with an anode of the first rectifier diode D1, and a cathode of the first rectifier diode D1 is connected with an input terminal of the first filter circuit 5. A second terminal of the first filter circuit 5 is connected with a second terminal of the sampling resistance R0.

The first filter circuit 5 may include a first filter capacitor C51 and a first filter diode D51.

A first terminal of the first filter capacitor C51 is connected with a cathode of the first filter diode D51 and the input terminal of the first filter circuit 5. A second terminal of the first filter capacitor C51 is connected with an anode of the first filter diode D51 and an output terminal of the first filter circuit 5.

The power supply voltage supply unit 4 is configured to generate the power supply voltage Vtest of the grounding detection apparatus in accordance with voltages of the live line connection terminal L and the neutral line connection terminal N. The power supply voltage supply unit 4 may convert an AC voltage of 220V to a DC voltage of 5V, as the power supply voltage Vtest of the grounding detection apparatus.

Figure 3:
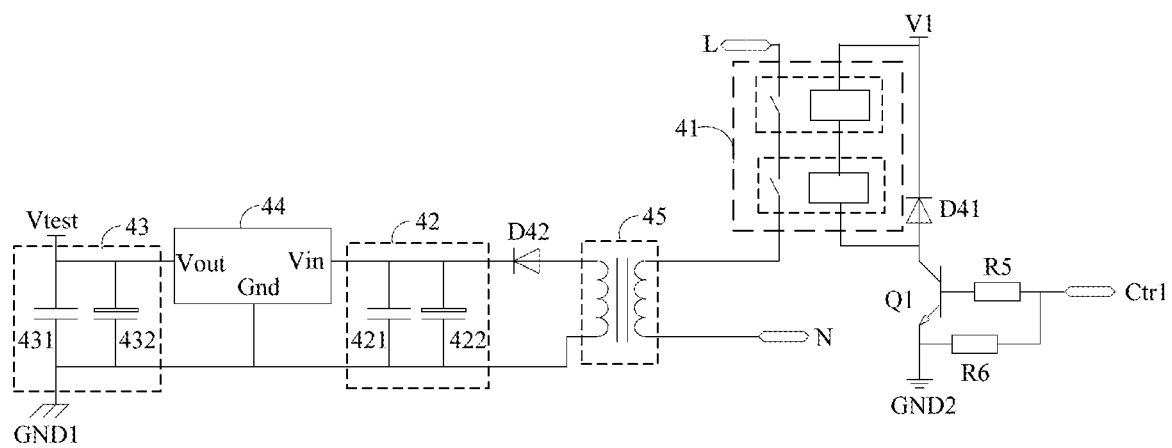
FIG. 3 schematically illustrates a structural diagram of a power supply voltage supply unit according to an embodiment of the present disclosure.

Referring to FIG. 3, the power supply voltage supply unit 4 may include: a first transistor Q1, a fifth resistance R5, a sixth resistance R6, a first diode D41, a first relay group 41, a transformer 45, a second rectifier diode D42, a second filter circuit 42, a voltage regulator 44 and a third filter circuit 43.

An anode and a cathode of the first diode D41 are respectively connected with two primary winding connection terminals of the first relay group 41. A first input terminal of the live line connection terminal L and a first input terminal of the transformer 45 are respectively connected with two secondary winding connection terminals of the first relay group 41.

A cathode of the first diode D41 is also configured to receive a first voltage V1, and the first voltage V1 may be 12 V±5%. An anode of the first diode D41 is also connected with a collector of the first transistor Q1. A base of the first transistor Q1 is connected with a first terminal of the fifth resistance R5. An emitter of the first transistor Q1 is connected with a first terminal of the sixth resistance R6 and a second reference grounding terminal GND2. A second terminal of the fifth resistance R5 is connected with a second terminal of the sixth resistance R6.

A second input terminal of the transformer 45 is connected with the neutral line connection terminal N. A first output terminal of the transformer 45 is connected with an anode of the second rectifier diode D42. A cathode of the second rectifier diode D42 is connected with an input terminal of the second filter circuit 42. An output terminal of the second filter circuit 42 is connected with an input terminal Vin of the voltage regulator 44.

An output terminal Vout of the voltage regulator 44 is connected with an input terminal of the third filter circuit 43. An output terminal of the third filter circuit 43 is configured to supply the power supply voltage Vtest of the grounding detection apparatus. A second output terminal of the transformer 45, a grounding terminal of the second filter circuit 42, a grounding terminal Gnd of the voltage regulator 44 and a grounding terminal of the third filter circuit 43 are all connected with the first reference grounding terminal GND1.

The second filter circuit 42 and the third filter circuit 43 may filter noises from both sides. The second filter circuit 42 may include a capacitor 421 and a capacitor 422 connected in parallel. Wherein, the capacitor 422 is a large capacitor, the capacitor 421 is a small capacitor, and the capacitor 422 and capacitor 421 can cooperate with each other to filter noises in high and low frequency band. Similarly, the third filter circuit 43 may include a capacitor 431 and a capacitor 432 connected in parallel. Wherein, the capacitor 432 is a large capacitor, and the capacitor 431 is a small capacitor.

The first relay group 41 may include a relay or a plurality of relays connected in series.

When the first relay group 41 includes a relay, a contact gap of the relay is greater than or equal to 3 mm, and two connection terminals of primary winding of the relay are the two primary winding connection terminals of the first relay group 41. Two connection terminals of secondary winding of the relay are the two secondary winding connection terminals of the first relay group 41.

When the first relay group 41 includes a plurality of relays, the plurality of relays are connected in series. Two relays connected in series to form the first relay group 41 are shown in FIG. 3.

When the first relay group 41 includes two relays, each relay has a contact gap of greater than or equal to 1.5 mm. A first connection terminal of a primary winding of the first relay is one primary winding connection terminal of the first relay group 41, and a second connection terminal of a primary winding of the second relay is the other primary winding connection terminal of the first relay group 41. A second connection terminal of the primary winding of the first relay is connected with a first connection terminal of the primary winding of the second relay.

A first connection terminal of secondary winding of the first relay is one secondary winding connection terminal of the first relay group 41, and a second connection terminal of secondary winding of the second relay is the other secondary winding connection terminal of the first relay group 41. A second connection terminal of the secondary winding of the first relay is connected with a first connection terminal of the secondary winding of the second relay. It is understood that one of ordinary skill in the art can infer that the first relay group 41 may consist of more relays according to the two relays provided in the present embodiment, which will not be described herein.

The power supply voltage supply unit 4 may supply a power supply voltage Vtest to each component of the grounding detection apparatus. When the first transistor Q1 is turned on, the power supply voltage supplying unit 4 is operated to supply the power supply voltage Vtest of the grounding detection apparatus. When the first transistor Q1 is turned off, the power supply voltage supply unit 4 stops working. Therefore, by controlling the first transistor Q1, it is possible to turn on or turn off the power supply voltage supply unit 4.

In order to save the overall power consumption of the grounding detection apparatus, the first transistor Q1 may be turned off after determining the grounding state of the grounding terminal. Accordingly, the detection circuit may further include a second control unit (not shown) configured to turn off the first transistor Q1 after determining the grounding state of the grounding terminal PE. A control signal of the second control unit turning off the first transistor Q1, can be input to the base of the first transistor Q1 by a first control terminal Ctrl.

Figure 4:
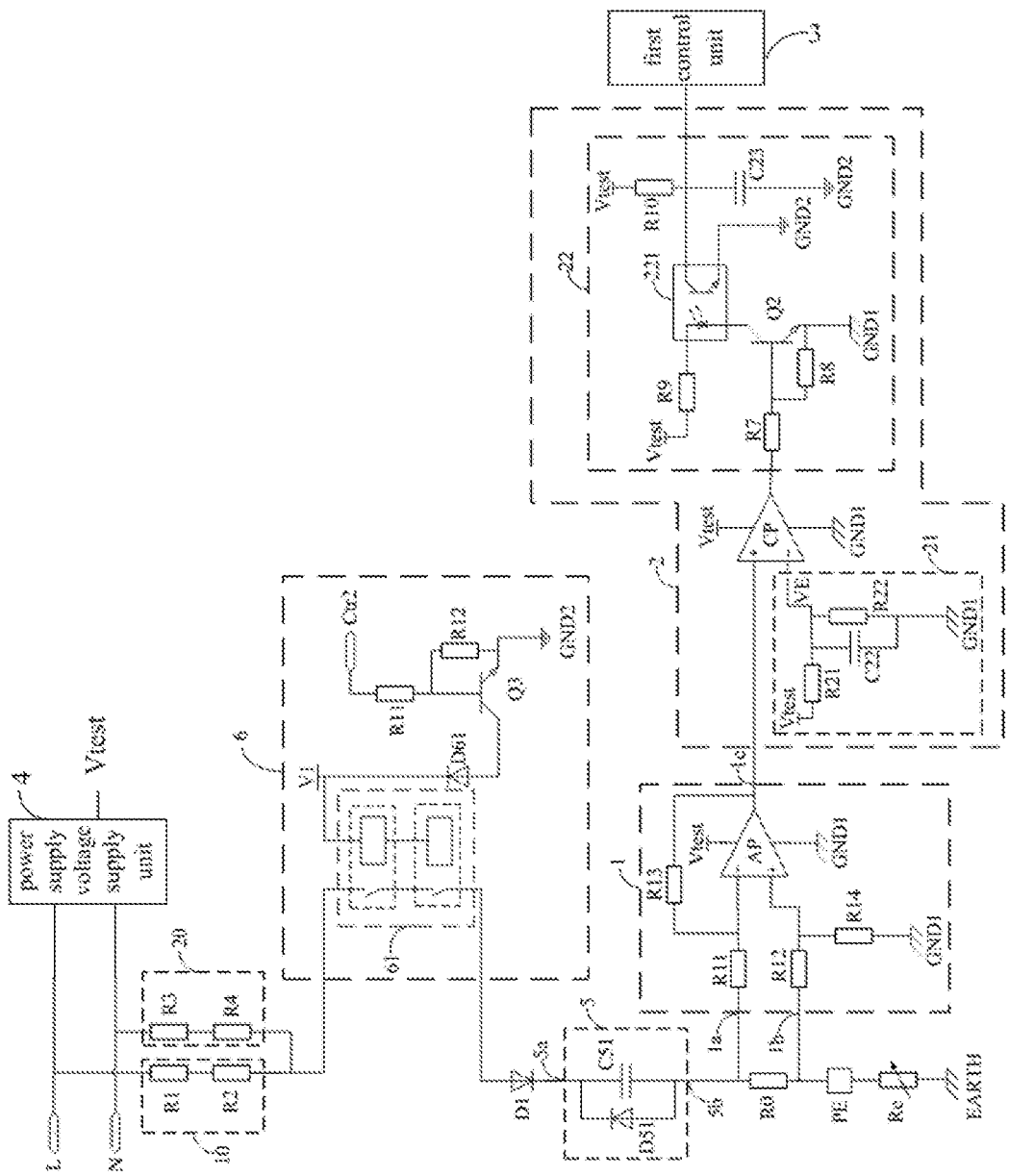
FIG. 4 schematically illustrates a structural diagram of a grounding detection apparatus according to another embodiment of the present disclosure.

As shown in FIG. 4, a comparison unit 2 in the present embodiment may further include an isolation circuit 22.

An output terminal of a comparator CP is connected with an output terminal of the comparison unit 2 through the isolation circuit 22. The isolation circuit 22 includes a second transistor Q2, a seventh resistance R7, an eighth resistance R8, a ninth resistance R9 and a photoelectric coupler 221.

A first input terminal of the photoelectric coupler 221 is connected with a first terminal of the ninth resistance R9. A second input terminal of the photoelectric coupler 221 is connected with a collector of the second transistor Q2. A first output terminal of the photoelectric coupler 221 is connected with the output terminal of the comparison unit 2. A second output terminal of the photoelectric coupler 221 is connected with a second reference grounding terminal GND2.

A second terminal of the ninth resistance R9 is configured to receive a power supply voltage Vtest of the grounding detection apparatus. A first terminal of the seventh resistance R7 is connected with the output terminal of the comparator CP. A second terminal of the seventh resistance R7 is connected with a first terminal of the eighth resistance R8 and a base of the second transistor Q2. A second terminal of the eighth resistance R8 is connected with an emitter of the second transistor Q2 and a first reference grounding terminal GND1.

When the comparator CP outputs a low level, the second transistor Q2 is turned off, the output terminal of the comparison unit 2 outputs a high level; and when the comparator CP outputs a high level, the second transistor Q2 is turned on, the output terminal of the comparison unit 2 outputs a low level. The second transistor Q2 can increase capability of driving the photoelectric coupler 221.

Therefore, when the comparison unit 2 includes the isolation circuit 22, if the first output terminal of the photoelectric coupler 221 outputs a pulse signal, then the output terminal of the comparing unit 2 outputs a pulse signal, indicating that the grounding state is normal; and if the first output terminal of the photoelectric coupler 221 continues to output a high level, the output terminal of the comparing unit 2 outputs a continuous high level, indicating that the ground state is abnormal.

The isolation circuit further includes a tenth resistance R10 and a third filter capacitor C23 in order to filter interference noises. A first terminal of the tenth resistance R10 is configured to receive the power supply voltage Vtest of the grounding detection apparatus. A second terminal of the tenth resistance R10 is connected with a first terminal of the third filter capacitor C23 and the first output terminal of the photoelectric coupler. A second terminal of the third filter capacitor C23 is connected with the second reference grounding terminal GND2.

The first reference ground GND1 and the second reference ground GND2 in the present embodiment may be regarded as reference grounds of two circuit systems, and may have equal or unequal voltage values.

Referring to FIG. 4, the detection circuit may further include a switching unit 6.

A second terminal of a second resistance R2 may be connected with a first terminal of a sampling resistance R0 through the switch unit 6. The switching unit 6 may include a second relay group 61, a third transistor Q3, an eleventh resistance R11, a twelfth resistance R12 and a second diode D61.

An anode and a cathode of the second diode D61 are respectively connected with two primary winding connection terminals of the second relay group 61. A second terminal of the second resistance R2 and a first terminal of the sampling resistance R0 are respectively connected with two secondary winding connection terminals of the second relay group 61. The cathode of the second diode D61 is also configured to receive the first voltage V1. The anode of second diode D61 is also connected with a collector of the third transistor Q3.

A base of the third transistor Q3 is connected with a first terminal of the eleventh resistance R11 and a first terminal of the twelfth resistance R12. An emitter of the third transistor Q3 is connected with a second terminal of the twelfth resistance R12 and the second reference grounding terminal GND2.

The second relay group 61 may include a relay or a plurality of relays connected in series.

When the second relay group 61 includes a relay, a contact gap of the relay is greater than or equal to 3 mm, and two terminals of primary winding of the relay are the two primary winding connection terminals of the second relay group 61, and two connection terminals of secondary winding of the relay are the two secondary winding connection terminals of the second relay group 61.

When the second relay group 61 includes a plurality of relays, the plurality of relays are connected in series. Two relays connected in series to form the second relay group 61 are shown in FIG. 4.

When the second relay group 61 includes two relays, each relay has a contact gap of greater than or equal to 1.5 mm. A first connection terminal of primary winding of the first relay is one primary winding connection terminal of the second relay group 61, and second connection terminal of primary winding of the second relay is the other primary winding connection terminal of the second relay group 61, and a second connection terminal of the primary winding of the first relay is connected with a first connection terminal of the primary winding of the second relay.

A first connection terminal of secondary winding of the first relay is one secondary winding connection terminal of the second relay group 61, a second connection terminal of secondary winding of the second relay is the other secondary winding connection terminal of the second relay group 61, and a second connection terminal of the secondary winding of the first relay is connected with a first connection terminal of the secondary winding of the second relay. It is understood that, one of ordinary skill in the art can infer that the second relay group 61 may consist of more relays according to the two relays provided in the present embodiment, which will not be described herein.

When the switch circuit 6 is turned on, a sampling current is generated in a grounding circuit, and the grounding detection apparatus operates normally. When the switch circuit 6 is turned off, a sampling current can not generate in the grounding circuit, and the grounding detection apparatus stops working. The switch circuit 6 may be regarded as a switch component of the grounding detection apparatus. It is determined by the third transistor Q3 whether the switching circuit 6 is turned on or turned off.

When the third transistor Q3 is turned on, the switch circuit 6 is turned on, and when the third transistor Q3 is turned off, the switch circuit 6 is turned off. Therefore, by controlling the third transistor Q3, it is possible to turn on or turn off the grounding detection apparatus.

In order to save the overall power consumption of an electrical appliance, the third transistor Q3 can be turned off after determining the grounding state of the grounding terminal. Accordingly, the detection circuit may further include a third control unit (not shown) configured to turn off the third transistor Q3 after determining the grounding state of the grounding terminal PE. A control signal of the third control unit turning off the third transistor Q3 can be input to a base of the third transistor Q3 from a second control terminal Ctrl.

Figure 5:
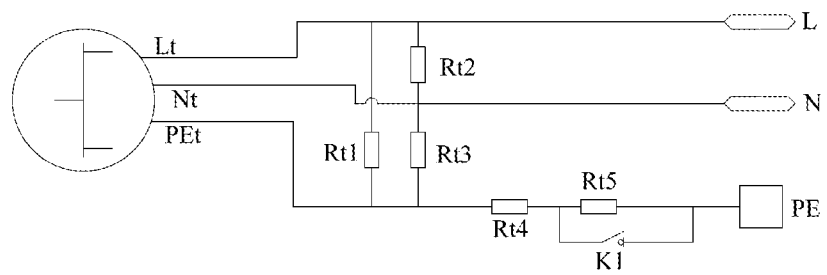
FIG. 5 schematically illustrates a structural diagram of a first test circuit according to an embodiment of the present disclosure.
Figure 6:
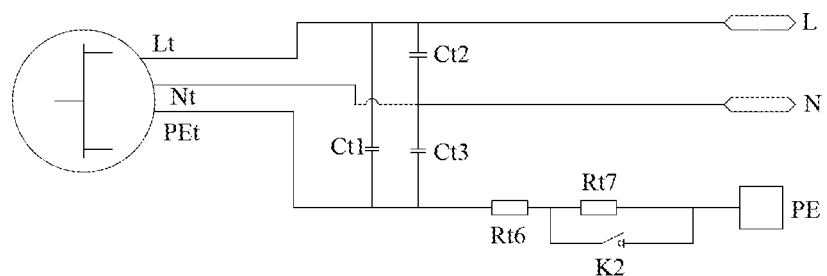
FIG. 6 schematically illustrates a structural diagram of a second test circuit according to an embodiment of the present disclosure.
Figure 7:
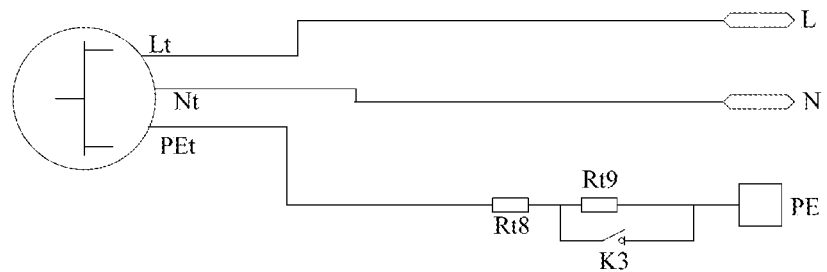
FIG. 7 schematically illustrates a structural diagram of a third test circuit according to an embodiment of the present disclosure.

In order to ensure that the detection circuit can work properly, the grounding detection apparatus of the present embodiment may further include a test circuit. FIG. 5 to FIG. 7 schematically illustrate structural diagrams of three kinds of test circuits.

As shown in FIG. 5, the first test circuit includes a live line test terminal Lt, a neutral line test terminal Nt, a grounding test terminal PEt, a first test resistance Rt1, a second test resistance Rt2, a third test resistance Rt3, a fourth test resistance Rt4, a fifth test resistance Rt5 and a first switch K1.

A first terminal of the first test resistance Rt1 is connected with the live line test terminal Lt, a first terminal of the second test resistance Rt2 and the live line connection terminal L. A second terminal of the first test resistance Rt1 is connected with the grounding test terminal PEt, a second terminal of the third test resistance Rt3 and a first terminal of the fourth test resistance Rt4.

A second terminal of the second test resistance Rt2 is connected with a neutral line test terminal Nt, a neutral line connection terminal N and a first terminal of the third test resistance Rt3. A second terminal of the fourth test resistance Rt4 is connected with a first terminal of the fifth test resistance Rt5 and a first terminal of the first switch K1. A second terminal of the fifth test resistance Rt5 is connected with a second terminal of the first switch K1 and the grounding terminal PE.

The first test resistance Rt1 has a resistance value of 10 MΩ±5%, the second test resistance Rt2 has a resistance value of 10 MΩ±5%, the third test resistance Rt3 has a resistance value of 10 MΩ±5%, the fourth test resistance Rt4 has a resistance value of 5Ω±5%, and the fifth test resistance Rt5 has a resistance value of 1 MΩ±5%.

When the first test circuit is in use, the live line test terminal Lt, the neutral line test terminal Nt and the grounding test terminal PEt of the first test circuit are respectively connected with a live line, a neutral line and a grounding line of an external power supply.

The fifth test resistance Rt5 is a resistance with a large resistance value, and can simulate a grounding resistance Re with a resistance value of greater than a predetermined value. The function of the detection circuit is normal: when the first switch K1 is closed, the comparison result output by the comparison unit 2 is a pulse signal, proving that the grounding state is normal; and when the first switch K1 is open, the comparison unit 2 outputs a continuous high level or a continuous low level. If the function of the detection circuit is abnormal, the comparison unit 2 can not output the above-mentioned corresponding signals.

Referring to FIG. 6, the second test circuit includes a live line test terminal Lt, a neutral line test terminal Nt, a grounding test terminal PEt, a first test capacitance Ct1, a second test capacitance Ct2, a third test capacitance Ct3, a sixth test resistance Rt6, a seventh test resistance Rt7 and a second switch K2.

A first terminal of the first test capacitor Ct1 is connected with the live line test terminal Lt, the first terminal of the second test capacitor Ct2 and the live line connection terminal L. A second terminal of the first test capacitor Ct1 is connected with the grounding test terminal PEt, a second terminal of the third test capacitor Ct3 and a first terminal of the sixth test resistance Rt6.

A second terminal of the second test capacitor is connected with the neutral line test terminal Nt, the live line connection terminal N and a first terminal of the third test capacitance Ct3. A second terminal of the sixth test resistance Rt6 is connected with a first terminal of the seventh test resistance Rt7 and a first terminal of the second switch K2. A second terminal of the seventh test resistance Rt7 is connected with a second terminal of the second switch K2 and the grounding terminal PE.

The first test capacitor Ct1 has a capacitance value of 0.2 μF±5%, the second test capacitance Ct2 has a capacitance value of 0.2 μF, the third test capacitance Ct3 has a capacitance value of 0.2 μF, the sixth test resistance Rt6 has a resistance value of 5Ω±5%, and the seventh test resistance Rt7 has a resistance value of 1 MΩ±5%.

Similar to the first test circuit, in the second test circuit, the seventh test resistance Rt7 simulates a grounding resistance Re with a resistance value of greater than a predetermined value. When the second test circuit is in use, the fire line test terminal Lt, the neutral line test terminal Nt and the grounding test terminal PEt of the second test circuit are respectively connected with a live line, a neutral line and a grounding line of an external power supply.

If the function of the detection circuit is normal, when the second switch K2 is closed, the comparison result output by the comparison unit 2 is a pulse signal, proving that the grounding is normal; and when the second switch K2 is open, the comparison unit 2 outputs a continuous high level or a continuous low level. If the function of the detection circuit is abnormal, the comparison unit 2 can not output the above-mentioned corresponding signals.

Referring to FIG. 7, the third test circuit includes a live line test terminal Lt, a neutral line test terminal Nt, a grounding test terminal PEt, an eighth test resistance Rt8, a ninth test resistance Rt9 and a third switch K3.

The neutral line test terminal Nt is connected with the neutral line connection terminal N. The live line test terminal Lt is connected with live line connection terminal L. A first terminal of the eighth test resistance Rt8 is connected with a grounding test terminal PEt. A second terminal of the eighth test resistance Rt8 is connected with a first terminal of the third switch K3 and a first terminal of the ninth test resistance Rt9. A second terminal of the ninth test resistance Rt9 is connected with a second terminal of the third switch K3 and the grounding terminal PE. The eighth test resistance Rt8 has a resistance value of 5Ω±5%. The ninth test resistance Rt9 has a resistance value of 1 MΩ±5%.

In the third test circuit, the ninth test resistance Rt9 simulates a grounding resistance Re exceeding a predetermined value. When the third test circuit is used, the live line test terminal Lt, the neutral line test terminal Nt and the grounding test terminal PEt of the second test circuit are respectively connected with a live line, a neutral line and a grounding line of an external power supply.

If the function of the detection circuit is normal, when the second switch K3 is closed, the comparison result output by the comparison unit 2 is a pulse signal, proving that the grounding state is normal; and when the second switch K3 is open, the comparison unit 2 outputs a continuous high level or a continuous low level. If the function of the detection circuit is abnormal, the comparison unit 2 can not output the above-mentioned corresponding signals.

Figure 8:
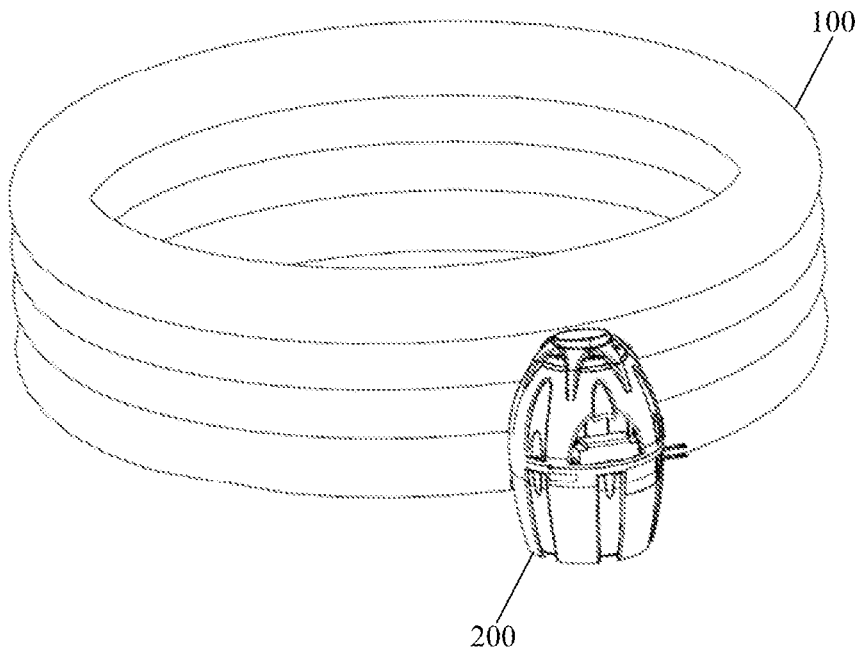
FIG. 8 schematically illustrates a structural diagram of a pool system according to an embodiment of the present disclosure.

The grounding terminal of the grounding detection apparatus in the present embodiment can be used as a grounding line of a pool system. As shown in FIG. 8, the pool system includes a pool 100 and a control system of the pool. A grounding terminal of the control system of the pool is connected with the grounding terminal PE of the grounding detection apparatus. The control system of the pool and the grounding detection apparatus may be disposed within a housing 200, wherein the housing 200 is disposed on an outer wall of the pool.

The pool 100 may be an air-filled pool having a square, rectangular, circular, elliptical or polygonal shape. The air-filled pool includes at least one air-filled chamber, the air-filled chamber is configured with a plurality of inner drawstring structures inside, and the plurality of inner drawstring structures are vertically or horizontally disposed inside the air-filled chamber.

A control method of the grounding detection apparatus is also provided in the present disclosure.

Figure 9:
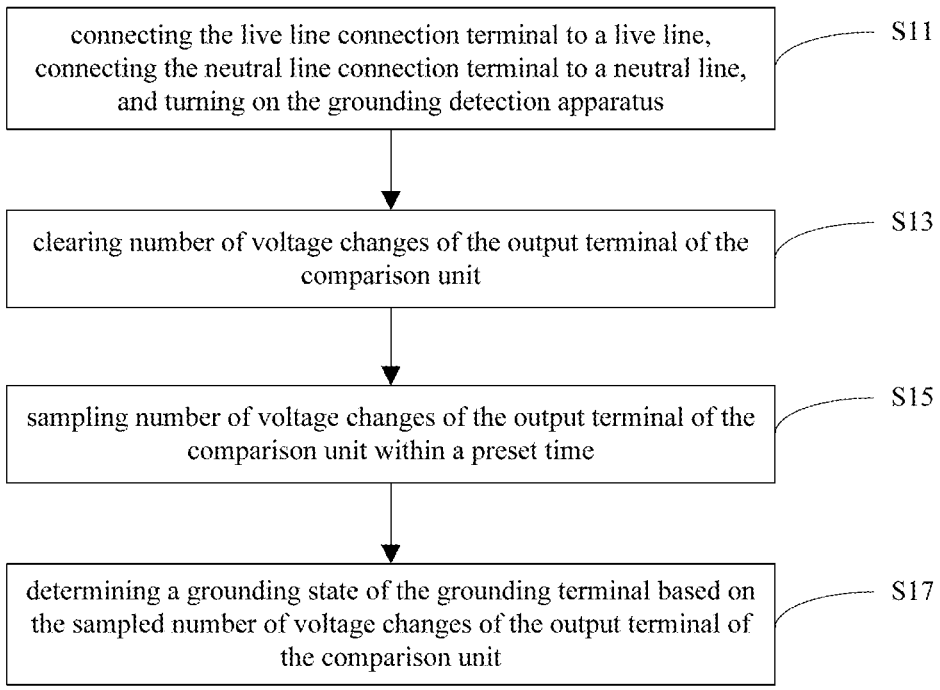
FIG. 9 schematically illustrates a flow chart of a control method of the grounding detection apparatus according to an embodiment of the present disclosure.

Referring to FIG. 9, FIG. 9 schematically illustrates a flow chart of a control method of the grounding detection apparatus according to an embodiment of the present disclosure. The control method includes:

in step S11, connecting the live line connection terminal to a live line, connecting the neutral line connection terminal to a neutral line, and turning on the grounding detection apparatus;

in step S13, clearing number of voltage changes of the output terminal of the comparison unit;

in step S15, sampling number of voltage changes of the output terminal of the comparison unit within a preset time; and in step S17, determining a grounding state of the grounding terminal based on the sampled number of voltage changes of the output terminal of the comparison unit.

In some embodiments, sampling the number of voltage changes of the output terminal of the comparison unit within the preset time includes counting once when the voltage changes from high to low.

In some embodiments, determining the grounding state of the grounding terminal based on the sampled number of voltage changes of the output terminal of the comparison unit includes: determining that the grounding state is abnormal when the number of the voltage changes is not within a preset range; or determining that the grounding state is normal when the number of the voltage changes is within the preset range.

In some embodiments, the control method further includes issuing an alarm information when the grounding state is abnormal.

A control method of the grounding detection apparatus is provided according to another embodiment of the present disclosure.

Figure 10:
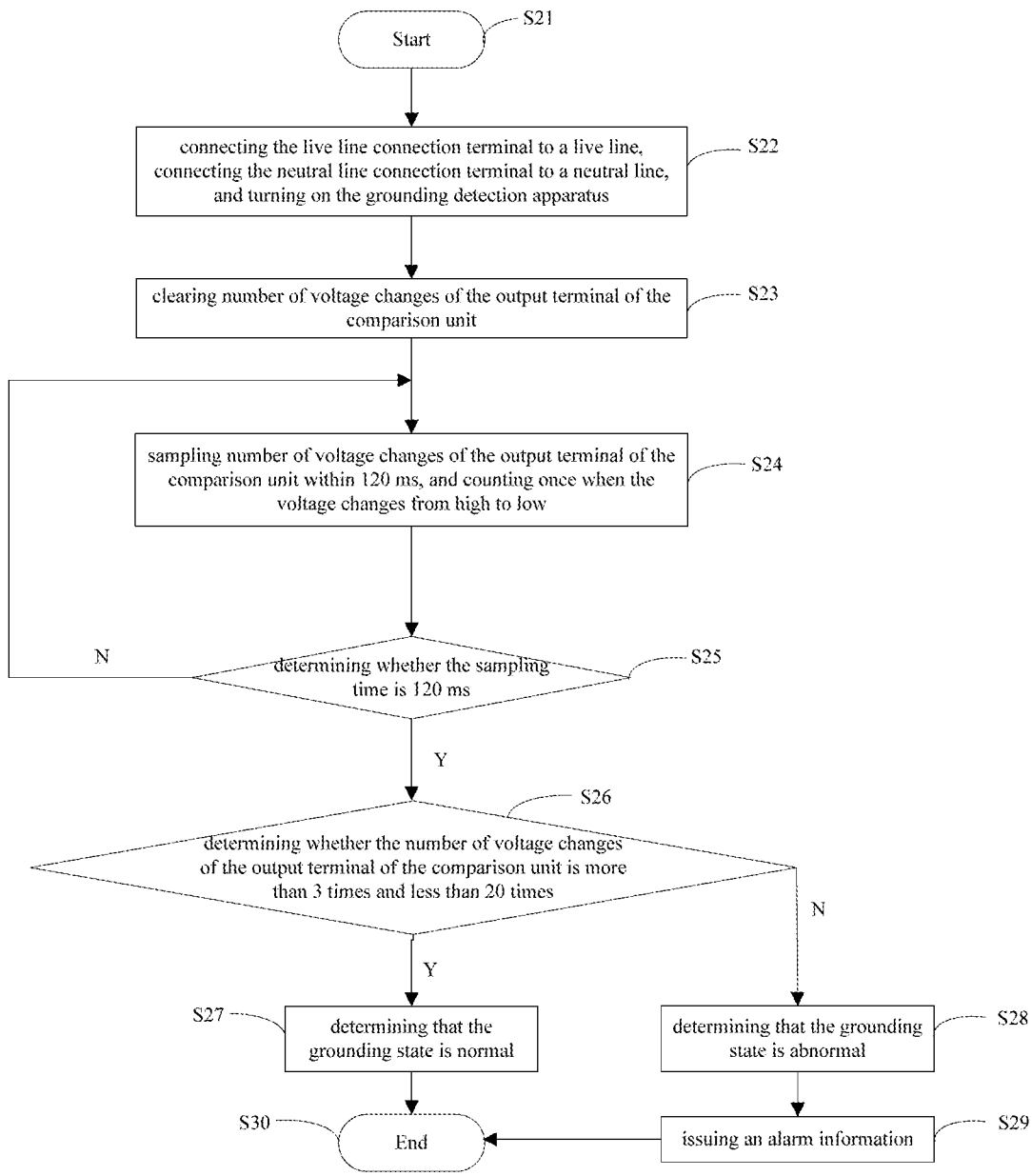
FIG. 10 schematically illustrates a flow chart of a control method of the grounding detection apparatus according to another embodiment of the present disclosure.

Referring to FIG. 10, FIG. 10 schematically illustrates a flow chart of a control method of the grounding detection apparatus according to another embodiment of the present disclosure. The control method includes:

in step S21, start;

in step S22, connecting the live line connection terminal to a live line, connecting the neutral line connection terminal to a neutral line, and turning on the grounding detection apparatus;

in step S23, clearing number of voltage changes of the output terminal of the comparison unit;

in step S24, sampling number of voltage changes of the output terminal of the comparison unit within a preset time, and counting once when the voltage changes from high to low;

in step S25, determining whether the sampling time is 120 ms, if yes, the control method is directed to step S26, otherwise, the control method is directed to step S24, that is, sampling the number of voltage changes again;

in the step S26, determining whether the number of voltage changes of the output terminal of the comparison unit is more than 3 times and less than 20 times;

if yes, the control method is directed to step S27, determining that the ground state is normal; or if no, the control method is directed to step S28, determining that the ground state is abnormal, and then to step S29, issuing an alarm information; and in step S30, end.

In this embodiment, the preset time is 120 ms, and the preset range is 3 times to 20 times. It should be noted that, the preset time and the preset range are only for exemplary purpose, but not limited thereto.

Although the present invention has been described above, the present invention is not limited to this. It should be understood by those skilled in the art that various changes and modifications may be made without departing from the spirit and scope of the invention, therefore the scope of protection of the invention should be defined by the claims.

What is claimed is:

1. A grounding detection apparatus, comprising:
   a detection circuit;
   wherein the detection circuit comprises a live line connection terminal, a neutral line connection terminal, a grounding terminal, a first impedance circuit, a sampling resistance, a differential amplifying circuit, a comparison unit and a power supply voltage supply unit;
   a first terminal of the first impedance circuit is connected with the live line connection terminal, and a second terminal of the first impedance circuit is connected with a first terminal of the sampling resistance and a first input terminal of the differential amplifying circuit;
   a second terminal of the sampling resistance is directly connected with a second input terminal of the differential amplifying circuit and the grounding terminal;
   the sampling resistance is configured to convert a sampling current to a sampling voltage, wherein the sampling current is a current on a circuit from the live line connection terminal to the grounding terminal;
   the differential amplifying circuit is configured to amplify the sampling voltage to form an amplified sampling voltage;
   the comparison unit is configured to compare a threshold voltage and the amplified sampling voltage and output a comparison result through an output terminal of the comparison unit; and
   the power supply voltage supply unit is configured to generate a power supply voltage of the grounding detection apparatus according to voltages of the live line connection terminal and the neutral line connection terminal;
   the power supply voltage supply unit comprising: a first transistor, a fifth resistance, a sixth resistance, a first relay group, a first diode, a transformer, a second rectifier diode, a voltage regulator, a second filter circuit and a third filter circuit;

the first relay group including a relay or a plurality of relays connected in series;

an anode and a cathode of the first diode respectively connected with two primary winding connection terminals of the first relay group;

the live line connection terminal and a first input terminal of the transformer respectively connected with two secondary winding connection terminals of the first relay group;

the cathode of the first diode being further configured to receive a first voltage, and the anode of the first diode connected with a collector of the first transistor;

a base of the first transistor connected with a first terminal of the fifth resistance, an emitter of the first transistor connected with a first terminal of the sixth resistance and a second reference grounding terminal;

a second terminal of the fifth resistance connected with a second terminal of the sixth resistance;

a second input terminal of the transformer connected with the neutral line connection terminal, a first output terminal of the transformer being connected with an anode of the second rectifier diode;

a cathode of the second rectifier diode connected with an input terminal of the second filter circuit;

an output terminal of the second filter circuit connected with an input terminal of the voltage regulator;

an output terminal of the voltage regulator connected with an input terminal of the third filter circuit;

an output terminal of the third filter circuit configured to supply the power supply voltage of the grounding detection apparatus; and a second output terminal of the transformer, a grounding terminal of the second filter circuit, a grounding terminal of the voltage regulator and a grounding terminal of the third filter circuit being all connected with a first reference grounding terminal.

2. The grounding detection apparatus according to claim 1, wherein the first impedance circuit comprises: a first resistance and a second resistance;

a first terminal of the first resistance is connected with the first terminal of the first impedance circuit, and a second terminal of the first resistance is connected with a first terminal of the second resistance; and a second terminal of the second resistance is connected with the second terminal of the first impedance circuit, and the first resistance has a same resistance value as the second resistance.

3. The grounding detection apparatus according to claim 2, wherein both the first resistance and the second resistance have a resistance value of 1 M$\Omega$±5%.

4. The grounding detection apparatus according to claim 2, wherein the detection circuit further comprises: a second impedance circuit; and a first terminal of the second impedance circuit is connected with the neutral line connection terminal, and a second terminal of the second impedance circuit is connected with the first terminal of the sampling resistance and the first input terminal of the differential amplifying circuit.

5. The grounding detection apparatus according to claim 4, wherein the second impedance circuit comprises a third resistance and a fourth resistance;

a first terminal of the third resistance is connected with the first terminal of the second impedance circuit, and a second terminal of the third resistance is connected with a first terminal of the fourth resistance; and a second terminal of the fourth resistance is connected with the second terminal of the second impedance circuit, the third resistance has a same resistance value as the first resistance, and the fourth resistance has a same resistance value as the first resistance.

6. The grounding detection apparatus according to claim 5, wherein both the third resistance and the fourth resistance have a resistance value of 1 M$\Omega$±5%.

7. The grounding detection apparatus according to claim 1, wherein the sampling resistance has a resistance value of 4.7 K$\Omega$±5%.

8. The grounding detection apparatus according to claim 1, wherein the sampling current has a peak value of no more than 0.7 mA.

9. The grounding detection apparatus according to claim 1, wherein the detection circuit further comprises a first filter circuit, and the differential amplifying circuit is a single power supply differential amplifying circuit or a dual power supply differential amplifying circuit;

when the differential amplifying circuit is a single power supply differential amplifying circuit, the detection circuit further comprises a first rectifier diode, the first rectifier diode and the first filter circuit are connected in series, the second terminal of the first impedance circuit is connected with the first terminal of the sampling resistance through the first rectifier diode and the first filter circuit; and when the differential amplifying circuit is a dual power supply differential amplifying circuit, the second terminal of the first impedance circuit is connected with the first terminal of the sampling resistance through the first filter circuit.

10. The grounding detection apparatus according to claim 9, wherein the first filter circuit comprises a first filter capacitor and a first filter diode;

a first terminal of the first filter capacitor is connected with a cathode of the first filter diode and an input terminal of the first filter circuit; and a second terminal of the first filter capacitor is connected with an anode of the first filter diode and an output terminal of the first filter circuit.

11. The grounding detection apparatus according to claim 1, wherein the differential amplifying circuit comprises: a first bias resistance, a second bias resistance, a third bias resistance, a fourth bias resistance and a differential amplifier;

a first terminal of the first bias resistance is connected with the first input terminal of the differential amplifying circuit, and a second terminal of the first bias resistance is connected with a first terminal of the third bias resistance and an inverting phase input terminal of the differential amplifier;

a first terminal of the second bias resistance is connected with the second input terminal of the differential amplifying circuit, and a second terminal of the second bias resistance is connected with a first terminal of the fourth bias resistance and a positive phase input terminal of the differential amplifier;

a second terminal of the third bias resistance is connected with an output terminal of the differential amplifier;

a power supply terminal of the differential amplifier is configured to receive a power supply voltage of the grounding detection apparatus, a grounding terminal of the differential amplifier is connected with a first reference grounding terminal, and the output terminal of the differential amplifier is connected with an output terminal of the differential amplifying circuit, and a second terminal of the fourth bias resistance is configured to be connected with the first reference grounding terminal.

12. The grounding detection apparatus according to claim 1, wherein the comparison unit comprises a comparison circuit;

the comparison circuit comprising: a comparator and a threshold voltage supply unit;

the threshold voltage supply unit is configured to supply the threshold voltage to an inverting phase input terminal of the comparator; and a positive phase input terminal of the comparator is connected with the output terminal of the differential amplifying circuit, a power supply terminal of the comparator is configured to receive a power supply voltage of the grounding detection apparatus, a grounding terminal of the comparator is connected with a first reference grounding terminal, and an output terminal of the comparator is connected with the output terminal of the comparison unit.

13. The grounding detection apparatus according to claim 12, wherein the threshold voltage supply unit comprises: a first voltage divider resistance, a second voltage divider resistance and a second filter capacitor;

a first terminal of the first voltage divider resistance is configured to receive the power supply voltage of the grounding detection apparatus, a second terminal of the first voltage divider resistance is connected with a first terminal of the second voltage divider resistance, a first terminal of the second filter capacitor and the inverting phase input terminal of the comparator; and a second terminal of the second voltage divider resistance is connected with a second terminal of the second filter capacitor and the first reference grounding terminal.

14. A grounding detection apparatus, comprising:

a detection circuit, wherein the detection circuit comprises a live line connection terminal, a neutral line connection terminal, a grounding terminal, a first impedance circuit, a sampling resistance, a differential amplifying circuit, a comparison unit and a power supply voltage supply unit;

a first terminal of the first impedance circuit is connected with the live line connection terminal, and a second terminal of the first impedance circuit is connected with a first terminal of the sampling resistance and a first input terminal of the differential amplifying circuit;

a second terminal of the sampling resistance is connected with a second input terminal of the differential amplifying circuit and the grounding terminal;

the sampling resistance is configured to convert a sampling current to a sampling voltage, wherein the sampling current is a current on a circuit from the live line connection terminal to the grounding terminal;

the differential amplifying circuit is configured to amplify the sampling voltage to form an amplified sampling voltage;

the comparison unit is configured to compare a threshold voltage and the amplified sampling voltage and output a comparison result through an output terminal of the comparison unit;

wherein the comparison unit comprises a comparison circuit, the comparison circuit comprising:

a comparator and a threshold voltage supply unit, the threshold voltage supply unit is configured to supply the threshold voltage to an inverting phase input terminal of the comparator;

a positive phase input terminal of the comparator is connected with the output terminal of the differential amplifying circuit, a power supply terminal of the comparator is configured to receive a power supply voltage of the grounding detection apparatus, a grounding terminal of the comparator is connected with a first reference grounding terminal, and an output terminal of the comparator is connected with the output terminal of the comparison unit;

wherein the comparison unit further comprises:

an isolation circuit;

the output terminal of the comparator is connected with the output terminal of the comparison unit through the isolation circuit, and the isolation circuit comprises a second transistor, a seventh resistance, an eighth resistance, a ninth resistance and a photoelectric coupler;

a first input terminal of the photoelectric coupler is connected with a first terminal of the ninth resistance, a second input terminal of the photoelectric coupler is connected with a collector of the second transistor, a first output terminal of the photoelectric coupler is connected with the output terminal of the comparison unit, and a second output terminal of the photoelectric coupler is connected with a second reference grounding terminal;

a second terminal of the ninth resistance is configured to receive the power supply voltage of the grounding detection apparatus;

a first terminal of the seventh resistance is connected with the output terminal of the comparator, a second terminal of the seventh resistance is connected with a first terminal of the eighth resistance and a base of the second transistor; and a second terminal of the eighth resistance is connected with an emitter of the second transistor and the first reference grounding terminal; and the power supply voltage supply unit is configured to generate a power supply voltage of the grounding detection apparatus according to voltages of the live line connection terminal and the neutral line connection terminal.

15. The grounding detection apparatus according to claim 14, wherein the isolation circuit further comprises: a tenth resistance and a third filter capacitor;

a first terminal of the tenth resistance is configured to receive the power supply voltage of the grounding detection apparatus, a second terminal of the tenth resistance is connected with a first terminal of the third filter capacitor and the first output terminal of the photoelectric coupler; and a second terminal of the third filter capacitor is connected with the second reference grounding terminal.

16. The grounding detection apparatus of claim 1, wherein the first relay group comprises: a relay having a contact gap of greater than or equal to 3 mm; or the first relay group comprises two relays respectively having a contact gap of greater than or equal to 1.5 mm.

17. The grounding detection apparatus according to claim 1, wherein the detection circuit further comprises: a first control unit and a second control unit;

the first control unit is configured to determine a grounding state of the grounding terminal according to the comparison result; and the second control unit is configured to turn off the first transistor after determining the grounding state of the grounding terminal.

18. The grounding detection apparatus according to claim 1, wherein the detection circuit further comprises: a first control unit; and the first control unit determines a grounding state of the grounding terminal according to the comparison result.

19. The grounding detection apparatus according to claim 18, wherein the first control unit comprises: a monitoring unit and a determination unit;

the monitoring unit is configured to obtain number of voltage changes of the output terminal of the comparison unit within a preset time; and the determination unit is configured to determine that the grounding state is abnormal, when the number of voltage changes obtained by the monitoring unit is not within a preset range.

20. The grounding detection apparatus according to claim 19, wherein the preset time is 120 ms, and the preset range is between 3 and 20 voltage changes.

21. The grounding detection apparatus according to claim 18, wherein the detection circuit further comprises: an alarm unit; and the alarm unit is configured to issue an alarm information when the grounding state is abnormal.

22. A grounding detection apparatus, comprising:
a detection circuit;
wherein the detection circuit comprises a live line connection terminal, a neutral line connection terminal, a grounding terminal, a first impedance circuit, a sampling resistance, a differential amplifying circuit, a comparison unit and a power supply voltage supply unit;

a first terminal of the first impedance circuit is connected with the live line connection terminal, and a second terminal of the first impedance circuit is connected with a first terminal of the sampling resistance and a first input terminal of the differential amplifying circuit;

a second terminal of the sampling resistance is directly connected with a second input terminal of the differential amplifying circuit and the grounding terminal;

the sampling resistance is configured to convert a sampling current to a sampling voltage, wherein the sampling current is a current on a circuit from the live line connection terminal to the grounding terminal;

the differential amplifying circuit is configured to amplify the sampling voltage to form an amplified sampling voltage;

the comparison unit is configured to compare a threshold voltage and the amplified sampling voltage and output a comparison result through an output terminal of the comparison unit;

the power supply voltage supply unit is configured to generate a power supply voltage of the grounding detection apparatus according to voltages of the live line connection terminal and the neutral line connection terminal;

wherein the first impedance circuit comprises: a first resistance and a second resistance;

a first terminal of the first resistance is connected with the first terminal of the first impedance circuit, and a second terminal of the first resistance is connected with a first terminal of the second resistance; and a second terminal of the second resistance is connected with the second terminal of the first impedance circuit, and the first resistance has a same resistance value as the second resistance;

wherein the detection circuit further comprises: a switching unit;

the second terminal of the second resistance is connected with the first terminal of the sampling resistance through the switching unit, and the switching unit comprises a second relay group, a third transistor, an eleventh resistance, a twelfth resistance and a second diode;

the second relay group comprises a relay or a plurality of relays connected in series;

an anode and a cathode of the second diode are respectively connected with two primary winding connection terminals of the second relay group;

the second terminal of the second resistance and the first terminal of the sampling resistance are respectively connected with two secondary winding connection terminals of the second relay group;

the cathode of the second diode is further configured to receive a first voltage, and the anode of the second diode is also connected with a collector of the third transistor; and a base of the third transistor is connected with a first terminal of the eleventh resistance and a first terminal of the twelfth resistance, and an emitter of the third transistor is connected with a second terminal of the twelfth resistance and a second reference grounding terminal.

23. The grounding detection apparatus of claim 22, wherein the second relay group comprises: a relay having a contact gap of greater than or equal to 3 mm; or the second relay group comprises two relays respectively having a contact gap of greater than or equal to 1.5 mm.

24. The grounding detection apparatus according to claim 22, wherein the detection circuit further comprises: a first control unit and a third control unit;

the first control unit is configured to determine a grounding state of the grounding terminal according to the comparison result; and the third control unit is configured to turn off the third transistor after determining the grounding state of the grounding terminal.

25. A grounding detection apparatus, comprising:
a detection circuit, wherein the detection circuit comprises a live line connection terminal, a neutral line connection terminal, a grounding terminal, a first impedance circuit, a sampling resistance, a differential amplifying circuit, a comparison unit and a power supply voltage supply unit;

a first terminal of the first impedance circuit is connected with the live line connection terminal, and a second terminal of the first impedance circuit is connected with a first terminal of the sampling resistance and a first input terminal of the differential amplifying circuit;

a second terminal of the sampling resistance is connected with a second input terminal of the differential amplifying circuit and the grounding terminal;

the sampling resistance is configured to convert a sampling current to a sampling voltage, wherein the sampling current is a current on a circuit from the live line connection terminal to the grounding terminal;

the differential amplifying circuit is configured to amplify the sampling voltage to form an amplified sampling voltage;

the comparison unit is configured to compare a threshold voltage and the amplified sampling voltage and output a comparison result through an output terminal of the comparison unit;

the power supply voltage supply unit is configured to generate a power supply voltage of the grounding detection apparatus according to voltages of the live line connection terminal and the neutral line connection terminal;

a test circuit, wherein the test circuit comprises a first test circuit;

the first test circuit comprises a neutral line test terminal, a live line test terminal, a grounding test terminal, a first test resistance, a second test resistance, a third test resistance, a fourth test resistance, a fifth test resistance and a first switch;

a first terminal of the first test resistance is connected with the live line test terminal, a first terminal of the second test resistance and the live line connection terminal, and a second 20 terminal of the first test resistance is connected with the grounding test terminal, a second terminal of the third test resistance, and a first terminal of the fourth test resistance;

a second terminal of the second test resistance is connected with the neutral line test terminal, the neutral line connection terminal and a first terminal of the third test resistance;

a second terminal of the fourth test resistance is connected with a first terminal of the fifth test resistance and a first terminal of the first switch; and a second terminal of the fifth test resistance is connected with a second terminal of the first switch and the grounding terminal.

26. The grounding detection apparatus according to claim 25, wherein the first test resistance has a resistance value of 10 MΩ±5%;

the second test resistance has a resistance value of 10 MΩ±5%;

the third test resistance has a resistance value of 10 MΩ±5%;

the fourth test resistance has a resistance value of 5Ω±5%; and the fifth test resistance has a resistance value of 1 MΩ±5%.

27. A grounding detection apparatus comprising:

a detection circuit and a test circuit;

wherein the detection circuit comprises a live line connection terminal, a neutral line connection terminal, a grounding terminal, a first impedance circuit, a sampling resistance, a differential amplifying circuit, a comparison unit and a power supply voltage supply unit;

a first terminal of the first impedance circuit is connected with the live line connection terminal, and a second terminal of the first impedance circuit is connected with a first terminal of the sampling resistance and a first input terminal of the differential amplifying circuit;

a second terminal of the sampling resistance is directly connected with a second input terminal of the differential amplifying circuit and the grounding terminal;

the sampling resistance is configured to convert a sampling current to a sampling voltage, wherein the sampling current is a current on a circuit from the live line connection terminal to the grounding terminal;

the differential amplifying circuit is configured to amplify the sampling voltage to form an amplified sampling voltage;

the comparison unit is configured to compare a threshold voltage and the amplified sampling voltage and output a comparison result through an output terminal of the comparison unit; and the power supply voltage supply unit is configured to generate a power supply voltage of the grounding detection apparatus according to voltages of the live line connection terminal and the neutral line connection terminal;

wherein the test circuit comprises a second test circuit;

the second test circuit comprises a neutral line test terminal, a live line test terminal, a grounding test terminal, a first test capacitance, a second test capacitance, a third test capacitance, a sixth test resistance, a seventh test resistance and a second switch;

a first terminal of the first test capacitance is connected with the neutral line test terminal, a first terminal of the second test capacitance and the neutral line connection terminal, and a second terminal of the first test capacitance is connected with the grounding test terminal, a second terminal of the third test capacitance, and a first terminal of the sixth test resistance;

a second terminal of the second test capacitance is connected with the live line test terminal, the live line connection terminal and a first terminal of the third test capacitance;

a second terminal of the sixth test resistance is connected with a first terminal of the seventh test resistance and a first terminal of the second switch; and a second terminal of the seventh test resistance is connected with a second terminal of the second switch and the grounding terminal.

28. The grounding detection apparatus according to claim 27, wherein the first test capacitance has a capacitance value of 0.2 μF±5%;

the second test capacitance has a capacitance value of 0.2 μF;

the third test capacitance has a capacitance value of 0.2 μF;

the six test resistance has a resistance value of 5Ω±5%; and the seventh test resistance has a resistance value of 1 MΩ±5%.

29. A grounding detection apparatus comprising:

a detection circuit and a test circuit;

wherein the detection circuit comprises a live line connection terminal, a neutral line connection terminal, a grounding terminal, a first impedance circuit, a sampling resistance, a differential amplifying circuit, a comparison unit and a power supply voltage supply unit;

a first terminal of the first impedance circuit is connected with the live line connection terminal, and a second terminal of the first impedance circuit is connected with a first terminal of the sampling resistance and a first input terminal of the differential amplifying circuit;

a second terminal of the sampling resistance is directly connected with a second input terminal of the differential amplifying circuit and the grounding terminal;

the sampling resistance is configured to convert a sampling current to a sampling voltage, wherein the sampling current is a current on a circuit from the live line connection terminal to the grounding terminal;

the differential amplifying circuit is configured to amplify the sampling voltage to form an amplified sampling voltage;

the comparison unit is configured to compare a threshold voltage and the amplified sampling voltage and output a comparison result through an output terminal of the comparison unit; and the power supply voltage supply unit is configured to generate a power supply voltage of the grounding detection apparatus according to voltages of the live line connection terminal and the neutral line connection terminal;

wherein the test circuit comprises a third test circuit;

the third test circuit comprises a neutral line test terminal, a live line test terminal, a grounding test terminal, an eighth test resistance, a ninth test resistance and a third switch;

the neutral line test terminal is connected with the neutral line connection terminal;

the live line test terminal is connected with the live line connection terminal;

a first terminal of the eighth test resistance is connected with the grounding test terminal, and a second terminal of the eighth test resistance is connected with a first terminal of the third switch and a first terminal of the ninth test resistance; and a second terminal of the ninth test resistance is connected with a second terminal of the third switch and the grounding terminal.

30. The grounding detection apparatus according to claim 29, wherein the eighth test resistance has a resistance value of 5Ω±5%, and the ninth test resistance has a resistance value of 1 MΩ±5%.

31. A pool system, comprising:
a recreational pool, a control system for the pool, and a grounding detection apparatus;
the grounding detection apparatus including a detection circuit;
wherein the detection circuit comprises a live line connection terminal, a neutral line connection terminal, a grounding terminal, a first impedance circuit, a sampling resistance, a differential amplifying circuit, a comparison unit and a power supply voltage supply unit;
a first terminal of the first impedance circuit is connected with the live line connection terminal, and a second terminal of the first impedance circuit is connected with a first terminal of the sampling resistance and a first input terminal of the differential amplifying circuit;
a second terminal of the sampling resistance is directly connected with a second input terminal of the differential amplifying circuit and the grounding terminal;
the sampling resistance is configured to convert a sampling current to a sampling voltage, wherein the sampling current is a current on a circuit from the live line connection terminal to the grounding terminal;
the differential amplifying circuit is configured to amplify the sampling voltage to form an amplified sampling voltage;

the comparison unit is configured to compare a threshold voltage and the amplified sampling voltage and output a comparison result through an output terminal of the comparison unit; and the power supply voltage supply unit is configured to generate a power supply voltage of the grounding detection apparatus according to voltages of the live line connection terminal and the neutral line connection terminal;

wherein a grounding terminal of the control system is connected with the grounding terminal of the grounding detection apparatus.

32. The pool system according to claim 31, wherein the pool is an air-filled pool, and the air-filled pool has a square, rectangular, circular, elliptical or polygonal shape.

33. The pool system according to claim 32, wherein the air-filled pool comprises at least an air-filled chamber, the air-filled chamber is configured with a plurality of inner drawstring structures inside, and the plurality of inner drawstring structures are vertically or horizontally disposed inside the air-filled chamber.

34. A method of controlling the grounding detection apparatus according to claim 1, comprising:
connecting the live line connection terminal to a live line, connecting the neutral line connection terminal to a neutral line, and turning on the grounding detection apparatus;
clearing number of voltage changes of the output terminal of the comparison unit;
sampling number of voltage changes of the output terminal of the comparison unit within a preset time; and
determining a grounding state of the grounding terminal based on the sampled number of voltage changes of the output terminal of the comparison unit.

35. The method according to claim 34, wherein determining the grounding state of the grounding terminal based on the sampled number of voltage changes of the output terminal of the comparison unit comprises:
determining that the grounding state is abnormal when the number of the voltage changes is not within a preset range; or
determining that the grounding state is normal when the number of the voltage changes is within the preset range.

36. The method according to claim 35, wherein the preset time is 120 ms, and the preset range is between 3 and 20 voltage changes.

37. The method according to claim 34, sampling the number of voltage changes of the output terminal of the comparison unit within the preset time comprises:
counting once when the voltage changes from high to low.

38. The method according to claim 35, further comprising:
issuing an alarm information when the grounding state is abnormal.

* * * * *